(12) United States Patent
Lu et al.

(10) Patent No.: US 8,502,620 B2
(45) Date of Patent: Aug. 6, 2013

(54) BALUN SYSTEM AND METHOD

(75) Inventors: Jhe-Ching Lu, Tainan (TW);
Hsiao-Tsung Yen, Tainan (TW); Sally Liu, Hsin-Chu (TW); Tzu-Jin Yeh, Hsin-Chu (TW); Min-Chie Jeng, Taipei (TW)

(73) Assignee: Taiwan Semiconductor Maufucturing Company, Ltd., Hsin-Chu (TW)

( * ) Notice: Subject to any disclaimer, the term of this patent is extended or adjusted under 35 U.S.C. 154(b) by 322 days.

(21) Appl. No.: 12/944,847

(22) Filed: Nov. 12, 2010

(65) Prior Publication Data

US 2012/0119845 A1 May 17, 2012

(51) Int. Cl.
*H01P 5/10* (2006.01)
*H01P 3/08* (2006.01)
(52) U.S. Cl.
USPC .............................................. 333/25; 333/246
(58) Field of Classification Search
USPC ............................................. 333/25, 26, 246
See application file for complete search history.

(56) References Cited

U.S. PATENT DOCUMENTS

| | | | | |
|---|---|---|---|---|
| 4,882,553 | A | * | 11/1989 | Davies et al. .................. 333/26 |
| 6,653,910 | B2 | | 11/2003 | Escalera et al. |
| 6,683,510 | B1 | | 1/2004 | Padilla |
| 7,020,452 | B1 | | 3/2006 | Kobayashi |
| 2007/0268106 | A1 | | 11/2007 | Lee et al. |

OTHER PUBLICATIONS

"RF, RFIC & Microwave Theory Design, Balun Design," www.rfic.co.uk, Nov. 2007, 6 pages.

* cited by examiner

*Primary Examiner* — Dean O Takaoka
(74) *Attorney, Agent, or Firm* — Slater & Matsil, L.L.P.

(57) ABSTRACT

A system and method for transmitting signals is disclosed. An embodiment comprises a balun, such as a Marchand balun, which has a first transformer with a primary coil and a first secondary coil and a second transformer with the primary coil and a second secondary coil. The first secondary coil and the second secondary coil are connected to a ground plane, and the ground plane has slot lines located beneath the separation of the coils in the first transformer and the second transformer. The slot lines may also have fingers.

19 Claims, 6 Drawing Sheets

BALUN SYSTEM AND METHOD

TECHNICAL FIELD

The present embodiments relate generally to a system and method for transforming an electrical input signal and, more particularly, to a system and method for transforming an electrical input signal using a balun.

BACKGROUND

Baluns may be used in circuits for transforming an unbalancing signal into a balanced signal, and vice versa. This may be achieved through the use of balanced transformers to provide for an equal amplitude division and phase differential. In other words, a single, unbalanced signal may be split into two separate, balanced signals that are one hundred and eighty degrees out of phase.

Such balancing may be achieved by utilizing a coupled-line structure, in which an input line (that receives the unbalanced signal) is electromagnetically coupled through separate transformers to two separate output lines. The unbalanced incoming signal is transformed (through transformers formed by the coupled lines) into two separate balanced signals which are one hundred eighty degrees out of phase. In a particular embodiment known as a Marchand balun, the input line that receives the unbalanced signal remains open on one end, which allows the balun to be used with a wider range of bandwidths than otherwise possible.

However, conventional baluns have a myriad of problems and limitations. In particular, conventional baluns have a loss problem due to the current path that connects the coupled lines to ground. Additionally, the bandwidth of the balun may be constrained by the capacitive coupling that can occur between the coupled lines and the ground, thereby limiting the operation of the balun.

SUMMARY

These and other problems are generally solved or circumvented, and technical advantages are generally achieved, by embodiments which reduce the capacitive coupling in a balun.

In accordance with an embodiment, an electrical device comprises a first transformer located in a first metal layer, the first transformer comprising a primary line connected to an input port and a first secondary line in proximity to the primary line and connected to a first output port, the primary line and the first secondary line separated from each other by a first region of dielectric material. A second transformer comprises the primary line and a second secondary line in proximity to the primary line and connected to a second output port different from the first output port. A ground layer is located in a second metal layer, the ground layer comprising a first slot line, the first slot line comprising a non-conductive material and being located beneath the first region.

In accordance with another embodiment, an electrical device comprises a first line connected to a first port, the first line comprising a tuning line and a second line in proximity with the first line to form a first transformer, the second line connected to a second port, the second line being separated from the first line by a first region. A third line is in proximity with the first line to form a second transformer, the third line connected to a third port. A via connects the second line and the third line to a first reference voltage layer, the first reference voltage layer comprising a first slot line of dielectric material located directly beneath the first region.

In accordance with yet another embodiment, a method for forming an electrical device comprises forming a conductive ground plane over a substrate and forming a first slot line in the conductive ground plane, the first slot line comprising a first dielectric material. A primary transmission line is formed in proximity to a first transmission line and a second transmission line, the primary transmission line being separated from the first transmission line by a first region of second dielectric material, wherein the first slot line and the first region are located along a line perpendicular to the substrate.

An advantage of an embodiment is a reduced capacitive coupling during an even-mode portion of a signal while the capacitive coupling in an odd-mode portion of a signal is only slightly modified. As such, the overall operative bandwidth of the balun increases.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present embodiments provide many applicable inventive concepts that can be embodied in a wide variety of specific contexts. The specific embodiments discussed are merely illustrative of specific ways to make and use the embodiments, and do not limit the scope of the embodiments.

The present embodiments will be described with respect to embodiments in a specific context, namely a balun. The embodiments may also be applied, however, to other signal transmission devices.

Figure 1:
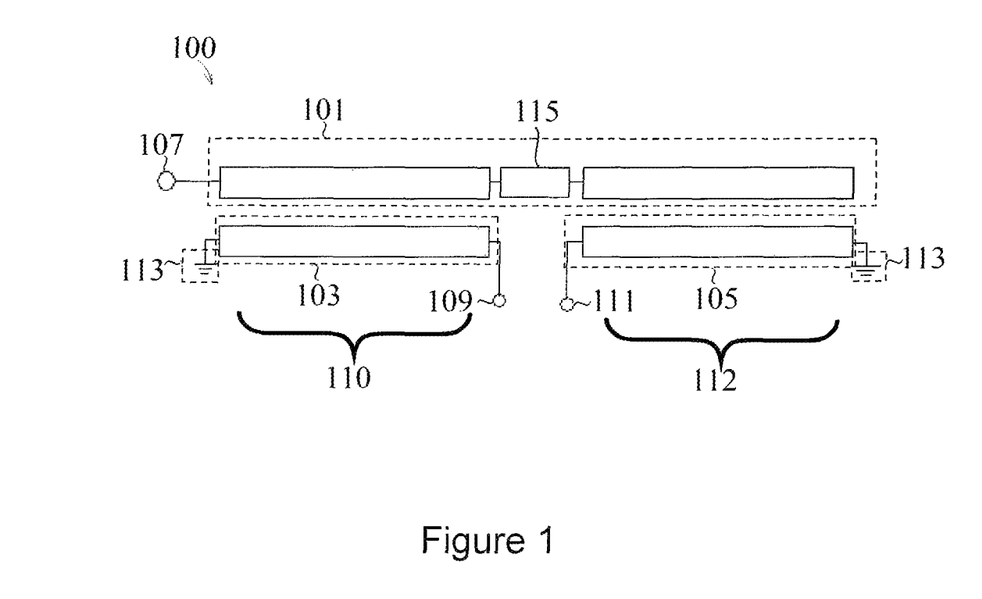
FIG. 1 illustrates a circuit diagram for a Marchand balun in accordance with an embodiment.

With reference now to FIG. 1, there is shown a diagram for a balun 100 that comprises a primary coil 101, a first secondary coil 103, and a second secondary coil 105. The balun 100 may be a microstrip, coupled-line balun formed, e.g., on a semiconductor substrate (not shown). As such, while the primary coil 101, the first secondary coil 103, and the second secondary coil 105 are described as coils, these structures may also be alternatively shaped lines, such as linear shaped or meandering shaped microstrip lines, as long as the primary coil 101, the first secondary coil 103, and the second secondary coil 105 are coupled as described in the following paragraphs.

In an embodiment, the primary coil 101 may be connected to an input port 107 to receive input signals such as radio frequency signals, microwave signals, or millimeter-waver signals. Opposite the input port 107, the primary coil 101 may be left open and not connected to ground, thereby forming a particular type of balun: a Marchand balun. By utilizing a Marchand balun (in which the primary coil is left open), the balun 100 can take advantage of wider bandwidths that can be achieved with a Marchand balun over a conventional microstrip, coupled-line balun.

However, as one of ordinary skill in the art will recognize, the specific types of balun embodied by the balun 100 illustrated in FIG. 1 are only intended to be illustrative, and are not intended to be limiting to the present embodiments. Any other suitable type of balun, such as a stripline, or microstrip, may alternatively be utilized with the present embodiments.

Optionally, a tuning line 115 may be utilized within the primary coil 101. The tuning line 115 may be used to adjust, or tune, the impedance of the primary coil 101. The adjustment may be made by manufacturing the tuning line 115 with a desired length in order to expand or contract the overall length of the primary coil 101. By adjusting the length, the impedance of the tuning line 115 and, therefore, the primary coil 101, may be matched to produce balanced amplitudes of the outputs of the balun 100 (described further below).

The first secondary coil 103 and the second secondary coil 105 may be placed in proximity to the primary coil 101 such that the primary coil 101 and the first secondary coil 103 form a first transformer 110 and the primary coil 101 and the second secondary coil 105 to form a second transformer 112. The first secondary coil 103 and the second secondary coil 105 may be positioned such that an electrical length of the first secondary coil 103 and the second secondary coil 105 is 90° at a center frequency of a signal applied at the input port 107. The first secondary coil 103 may be connected to a differential first output port 109 and the second secondary coil 105 may be connected to a differential second output port 111.

Figure 3A:
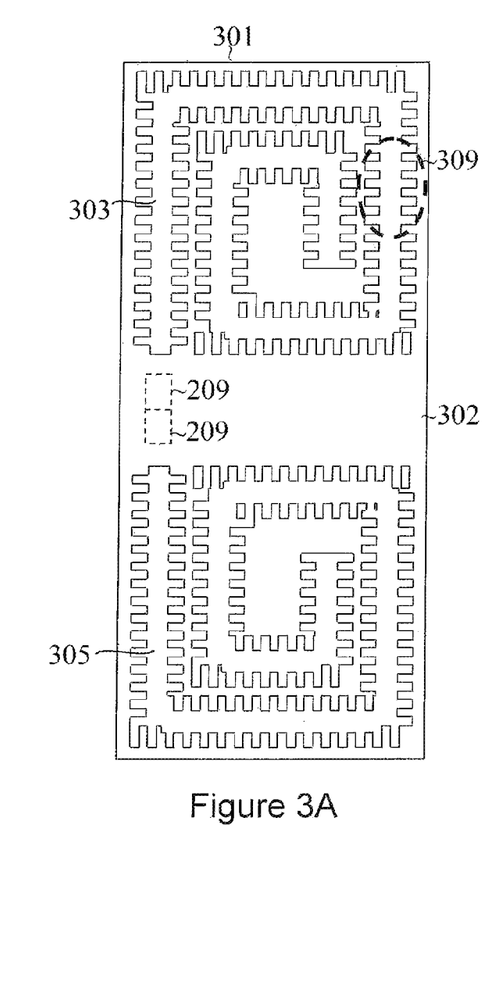
FIGS. 3A-3B illustrate a ground layer of the Marchand balun in accordance with an embodiment.

A ground structure 113 may be connected to the first secondary coil 103 and the second secondary coil 105. The ground structure 113 may provide a suitable reference voltage, such as 0 V, that allows for current to flow. Additionally, while the ground structure 113 is illustrated in FIG. 1 as two separate structures, this is merely illustrative, as the ground structure 113 may also be a single structure, as described below with respect to FIG. 3.

Figure 2:
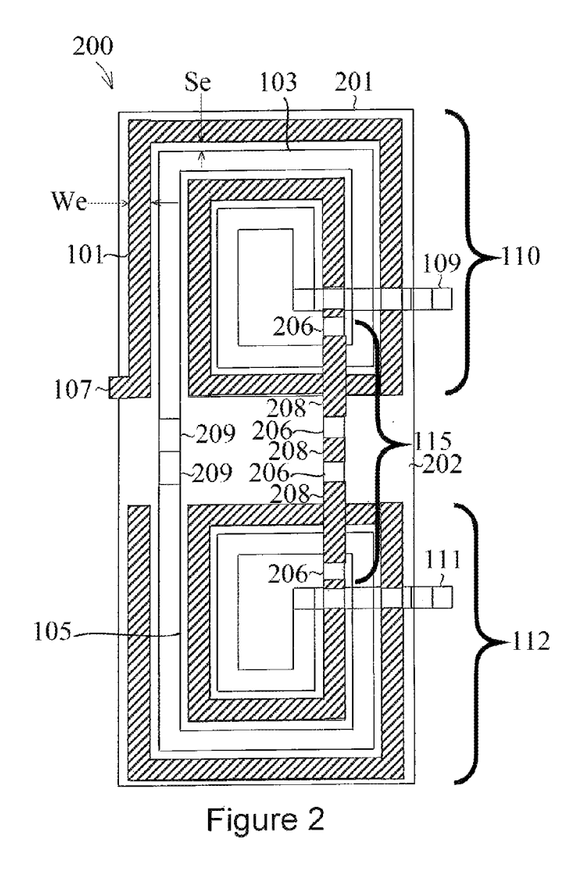
FIG. 2 illustrates a layout of a signal level of the Marchand balun in accordance with an embodiment.

FIG. 2 illustrates a structural layout 200 of a signal layer 201 of the balun 100 illustrated in FIG. 1. In an embodiment, the signal layer 201 may include the primary coil 101, the first secondary coil 103, the second secondary coil 105, and portions of the tuning line 115. In the signal layer 201 illustrated in FIG. 2 the primary coil 101 and the first secondary coil 103 are intertwined to form the first transformer 110 and the primary coil 101 and the second secondary coil 105 are intertwined to form the second transformer 112. Also illustrated are the primary coil's 101 connection to the input port 107 along with the first secondary coil's 103 connection to the first output port 109 and the second secondary coil's 105 connection to the second output port 111

The primary coil 101, the first secondary coil 103 and the second secondary coil 105 may be formed within a single metal layer of a semiconductor substrate (not shown) using, e.g., a 65 nm technology node with six metal layers and a single polysilicon layer. The primary coil 101, the first secondary coil 103 and the second secondary coil 105 may be formed from conductive materials such as copper, tungsten, or aluminum, combinations of these, or the like. Additionally, an insulative material 202 such as a dielectric may be utilized to separate the primary coil 101 from the first secondary coil 103 and the second secondary coil 105 in order to prevent a short-circuit between the various coils.

The primary coil 101, the first secondary coil 103, and the second secondary coil 105 may be manufactured utilizing back end of line (BEOL) manufacturing processes such as damascene, dual damascene, combinations of these, and the like. Such processes may include, e.g., the formation or deposition of a insulative layer, the formation of openings through the insulative layer, the formation or deposition of conductive materials into the openings through the insulative layer, and the removal of conductive material from outside of the openings through a planarization process such as chemical mechanical polishing (CMP).

However, as one of ordinary skill in the art will recognize, the processes described above are merely illustrative and are not meant to limit the present embodiments in any fashion. Any other suitable material or process may also be used to form the primary coil 101, the first secondary coil 103, and the second secondary coil 105. All such suitable materials and methods may alternatively be utilized.

As illustrated, the primary coil 101 and the first secondary coil 103 may be intertwined to form the first transformer 110. In an embodiment, the primary coil 101 and the first secondary coil 103 may have a similar width $W_e$ which may be decided based upon the process design rules utilized. Alternatively, the primary coil 101 and the first secondary coil 103 may have different widths, or may even have different widths at different locations within the primary coil 101 and the first secondary coil 103. Any suitable width or combination of widths may be utilized for the primary coil 101 and the first secondary coil 103 in the first transformer 110.

Additionally in the first transformer 110, the primary coil 101 and the first secondary coil 103 may be separated by the insulative material 202. In an embodiment the primary coil 101 and the first secondary coil 103 may be separated by a space $S_e$ which may be decided based upon the process design rules utilized. The $S_e$ prevents the primary coil 101 from shorting to the first secondary coil 103 while allowing the first transformer 110 to operate.

The primary coil 101 and the first secondary coil 103 in the first transformer 110 may be intertwined such that the first transformer 110 has a 1:1 transformer ratio, using, e.g., a turn and a half for each of the primary coil 101 and the first secondary coil 103. However, such a ratio is merely illustrative and is not meant to limit the present embodiments. Any other suitable transformer ratio (impedance transform ration including real part and/or imaginary part of impedances), such as 2:1, 1:4, or 3:2, and any other suitable number of turns, may alternatively be utilized.

The primary coil 101 may also be intertwined with the second secondary coil 105 to form the second transformer 112. Similar to the first transformer 110 discussed above, the primary coil 101 and the second secondary coil 105 may have the similar width $W_e$ based upon the process design rules utilized. Additionally, the primary coil 101 and the second secondary coil 105 in the second transformer 112 may be separated by the space $S_e$ and intertwined such that the second transformer 112 has a 1:1 transformer ratio, using, e.g., a turn and a half for each of the primary coil 101 and the second secondary coil 105. However, other spacings, transformer ratios and number of turns may alternatively be utilized.

Optionally, the primary coil 101 may extend from the first transformer 110 to the second transformer 112 through the tuning line 115. The tuning line 115 may connect the primary coil 101 in the first transformer 110 to the primary coil 101 in the second transformer 112 by, e.g., forming portions that extend into other metal layers through first vias 206. The first vias 206 allow the tuning line 115 to cross other sections of the first transformer 110 and the second transformer 112 without contacting those sections.

In an embodiment, the tuning line 115 uses a combination of first vias 206 and traces 208 that route the tuning line 115 into another metal layer. For example, as illustrated four first vias 206 may be utilized in order to route the tuning line 115 around the coils of the first transformer 110 and the second transformer 112, thereby lengthening the tuning line 115 to the desired length for a desired impedance of the primary coil 101. As an example only, the tuning line 115 may have a length of between about 20 μm and about 300 μm, such as about 40 μm, in order to tune the primary coil 101 into having a further improved impedance matching.

However, this length of the tuning line 115 and number of first vias 206 are merely illustrative and are not meant to limit the present embodiments. Any suitable length for tuning the impedance of the primary coil 101 and any suitable number of vias, such as two first vias 206, that allow the tuning line to connect the primary coil 101 in the first transformer 110 to the primary coil 101 in the second transformer 112 without contacting other conductive regions may alternatively be utilized. Furthermore, the tuning line 115 may extend into any number of metal layers (not shown) above and below the metal layer containing the signal layer 201.

In an embodiment the first secondary coil 103 and the second secondary coil 105 may be connected to the ground structure 113 (described more fully below with regards to FIG. 3) through one or more ground vias 209. The ground vias 209 may extend through the surrounding insulative material 202 in order to provide the connection to ground desired for the balun 100.

Similar to the primary coil 101, the first secondary coil 103, and the second secondary coil 105, the first vias 206 and the ground vias 209 may be formed using BEOL manufacturing techniques. As an example only, the first vias 206 and the ground vias 209 may be formed into an insulative material 202 using a damascene or dual damascene technique. However, these techniques are meant to be illustrative only, and any other suitable technique may alternatively be utilized to form the first vias 206 and the ground vias 209.

FIG. 3A illustrates the ground structure 113 (see FIG. 1). In the embodiment illustrated, the ground structure 113 is a ground plane 301 connected to the first secondary coil 103 and the second secondary coil 105 through the ground vias 209. The ground plane 301 may comprise a conductive portion 302 along with a non-conductive first slot line 303 and a non-conductive second slot line 305. The ground plane 301 may be located in a metal layer adjacent to the metal layer containing the signal layer 201 that includes the primary coil 101, the first secondary coil 103, and the second secondary coil 105, but the ground plane 301 is not limited to such.

Alternatively, the ground plane 301 may be located in any metal layer either above or below the metal layer containing the primary coil 101, the first secondary coil 103, and the second secondary coil 105. For example, in a six-metal layer, 0.18 μm technology node, the ground plane 301 may be formed in a sixth metal layer (from, e.g., a substrate, not shown) while the signal layer 201 may be formed in a first metal layer, with about 7.05 μm between the two layers. Other examples may include the ground plane 301 being formed in a sixth metal layer of a six-metal layer, 65 nm technology node while the signal layer 201 may be formed in the first metal layer, with about 3.6 μm between the two layers, or else the ground plane 301 being formed in a sixth metal layer of a six-metal layer, 40 nm technology node while the signal layer 201 is in the first metal layer, with about 1.865 μm separating the two layers. These examples, and any other suitable alternative configurations, may alternatively be utilized in the location of the ground plane 301 in relation to the signal layer 201.

In an embodiment the ground plane 301 may be patterned with the insulative material 202 to have the first slot line 303 and the second slot line 305. The ground plane 301 along with the first slot line 303 and the second slot line 305 may be formed using BEOL technology, such as through a damascene technique, a dual damascene technique, or the like, in which the insulative material 202 is formed and then the conductive portion 302 of the ground plane 301 is formed into the insulative material 202. However, any other suitable process, such as forming the conductive portion 302 of the ground plane 301 and then removing portions of the conductive portion 302 of the ground plane 301 to refill and form the first slot line 303 and the second slot line 305, may alternatively be utilized.

Figure 3B:
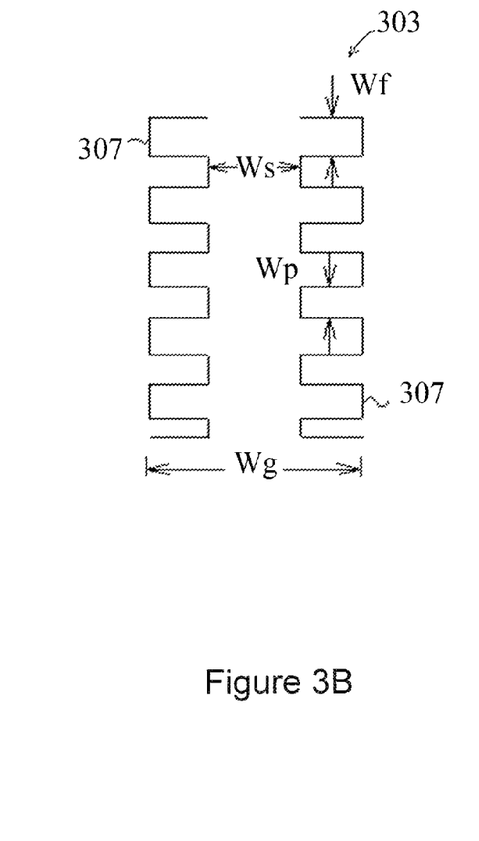

FIG. 3B illustrates an expanded view of the dotted circle 309 in FIG. 3A, and illustrates an expanded view of the first slot line 303. In an embodiment, the first slot line 303 may have a slot width $W_s$ in order to help adjust and reduce the capacitance between the ground plane 301 and the signal layer 201. As such, the first slot line 303 may have a slot width $W_s$ of between about 2 μm and about 18 μm, such as about 5 μm.

Additionally, FIG. 3B also illustrates that, in an embodiment, the first slot line 303 and the second slot line 305 may be patterned to form, e.g., fingers 307 that extend away from the first slot line 303 and the second slot line 305. The fingers 307 may be formed simultaneously with the first slot line 303 and the second slot line 305, and may be formed from similar material (e.g., insulative material 202). Similar to the first slot line 303 and the second slot line 305, the fingers 307 may be used to fine tune adjust the capacitance between the ground plane 301 and the signal layer 201, where a greater number of fingers 307 (and thereby a greater area of insulative material 202) reduces the capacitive coupling between the ground structure 113 and the signal layer 201. As such, in one embodiment, the fingers 307 may be formed to have a finger width $W_f$ of between about 1 μm and about 12 μm, such as about 2 μm, and a pitch spacing $W_p$ between adjacent fingers 307 of between about 1 μm and about 12 μm, such as about 2 μm. Additionally, the fingers 307 may extend away from the first slot line 303 such that the first slot line 303 may have a combined width $W_g$ (with the fingers 307) of between about 6 μm about 36 μm, such as about 12 μm. Finally, the fingers 307 may extend around the perimeter of both the first slot line 303 and the second slot line 305.

However, as one of ordinary skill in the art will recognize, the patterning of the ground plane around the first slot line 303 and the second slot line 305 into fingers 307 is merely one illustrative embodiment and is not meant to be limiting. The ground plane 301 may be patterned into any alternative desired shape, such as a sawtooth pattern, in order to help adjust and control the capacitive coupling and provide better performance. Any other suitable shapes, spacings, or dimensions, may alternatively be utilized.

Figure 4A:
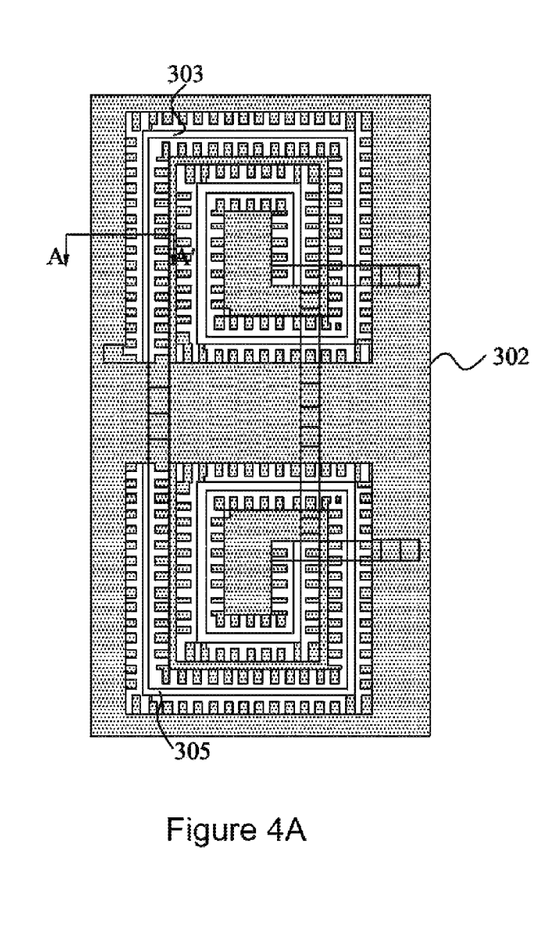
FIGS. 4A-4C illustrate a top-down and cross-sectional views of the Marchand balun in accordance with an embodiment.

FIG. 4A illustrates a top down view of the first transformer 110 and the second transformer 112 positioned over the ground plane 301 with the first slot line 303 and the second slot line 305. As illustrated, the first slot line 303 may be positioned such that both the primary coil 101 located in the first transformer 110 and the first secondary coil 103 overlie the first slot line 303, with the first slot line 303 extending between the primary coil 101 and the first secondary coil 103 (albeit in a separate metal layer). Additionally, the second slot line 305 may be positioned such that the primary coil 101 located in the second transformer 112 and the second secondary coil 105 overlie the second slot line 305 along with the fingers 307 that surround the second slot line 305.

Additionally, the first slot line 303 and the fingers 307 allow the return current of the signal to not flow under the signal coupled lines (e.g., the space between the first secondary coil 103 and the primary coil 101) but instead flow far away from the signal coupled lines, thereby increasing the equivalent even-mode and odd-mode inductances, reducing the velocity of the signal and also allowing for a reduction of the physical length of the coupled lines. Further, by utilizing the proposed embodiments, the overall size of the balun 100 may be reduced by about 40%. For example, while a conventional balun may have a width of about 85 μm and a length of about 196 μm, the balun 100 utilizing the present embodiments may reduce the capacitive coupling and allow the dimensions to be reduced to, e.g., a width of about 65 μm and a length of about 156 μm.

Figure 4B:
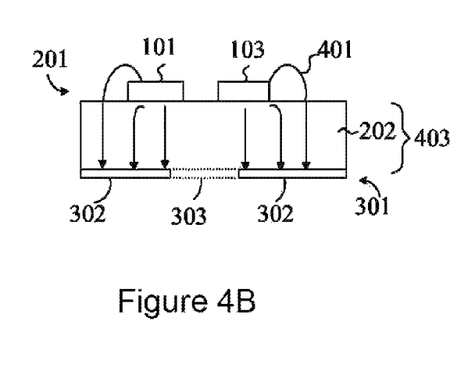

FIG. 4B illustrates a cross-sectional view of the ground plane 301 and the signal layer 201 along line A-A'. As illustrated, the ground plane 301 along with the first slot line 303 are separated from the primary coil 101 and the first secondary coil 103 by a single dielectric layer 403, although any suitable number of separating layers may alternatively be utilized. In an embodiment the first slot line 303 interrupts the ground plane 301 in the space between the primary coil 101 and the first secondary coil 103, thereby helping to reduce the capacitance between the ground plane 301 and the signal layer 201.

Additionally, as a signal that is applied to the input port 107 may be seen as a combination of an even-mode portion and an odd-mode portion, FIG. 4B also shows the electric fields 401 that are generated due to the even-mode portion of the signal. As shown, the break supplied by the first slot line 303 provides for a spacing out of the electric fields 401, thereby helping to reduce the capacitance between the ground plane 301 and the signal layer 201. Additionally, the even-mode impedance $Z_{even}$ during the even-mode portion of the signal may be found using the following equation:

$$Z_{even} = \sqrt{\frac{R_{even} + j\omega L_{even}}{G_{even} + j\omega C_{even}}}$$

Where:
$Z_{even}$=Even-mode Impedance
$R_{even}$=Even-mode Resistance
j=Imaginary Unit
ω=Radial Frequency
$L_{even}$=Even-mode Inductance
$G_{even}$=Even-mode Conductance
$C_{even}$=Even-mode Capacitance As such, when the slot width $W_s$ is increased, the even mode capacitance $C_{even}$ will go down, thereby increasing the even-mode impedance $Z_{even}$.

Figure 4C:
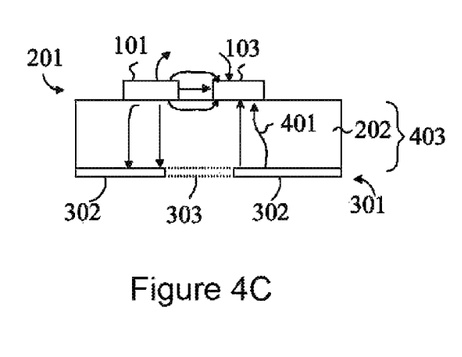

Similar to FIG. 4B, FIG. 4C illustrates the electric fields 401 that are generated from the odd-mode portion of the applied signal. As shown, the break supplied by the first slot line 303 again provides a spacing out of the electric fields, thereby helping to reduce the capacitance between the ground plane 301 and the signal layer 201 even in an odd-mode method of operation. Additionally, the odd-mode impedance $Z_{odd}$ during the odd-mode portion of the signal, may be found using the following equation:

$$Z_{odd} = \sqrt{\frac{R_{odd} + j\omega L_{odd}}{G_{odd} + j\omega C_{odd}}}$$

Where:
$Z_{odd}$=Odd-mode Impedance
$R_{odd}$=Odd-mode Resistance
j=Imaginary Unit
ω=Radial Frequency
$L_{odd}$=Odd-mode Inductance
$G_{odd}$=Odd-mode Conductance
$C_{odd}$=Odd-mode Capacitance Accordingly, as the slot width $W_s$ goes up, the odd-mode capacitance $C_{odd}$ will go down slightly, thereby slightly increasing the odd-mode impedance $Z_{odd}$, although not as much as the even-mode impedance $Z_{even}$.

Additionally, because the even-mode capacitance $C_{even}$ and the odd-mode capacitance $C_{odd}$ may be reduced (even though the even-mode capacitance may only be slightly reduced), and the even-mode inductance $L_{even}$ and odd-mode inductance $L_{odd}$ may be increased, the overall signal velocity $v_{overall}$ may be reduced. This may be seen from the following equations relating the even-mode signal velocity $v_{even}$ to the even-mode capacitance $C_{even}$, relating the odd-mode velocity $v_{odd}$ to the odd-mode capacitance $C_{odd}$, and relating the even-mode signal velocity $v_{even}$ and the odd-mode signal velocity $v_{odd}$ to the overall signal velocity $v_{overall}$:

$$v_{even} = \frac{1}{\sqrt{L_{even}C_{even}}}$$

$$v_{odd} = \frac{1}{\sqrt{L_{odd}C_{odd}}}$$

$$v_{overall} \approx \frac{v_{even} + v_{odd}}{2}$$

Accordingly, as this reduction in the signal velocity occurs, the physical length of the lines may be reduced, thereby reducing the overall size of the balun 100.

Figure 5:
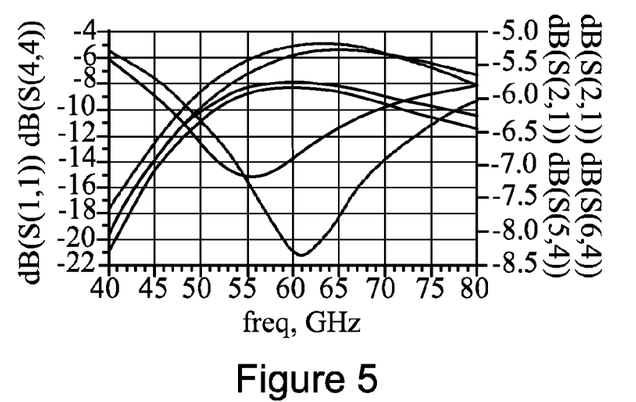
FIG. 5-6 illustrate improvements that may be realized in the Marchand balun in accordance with an embodiment.
Figure 6:
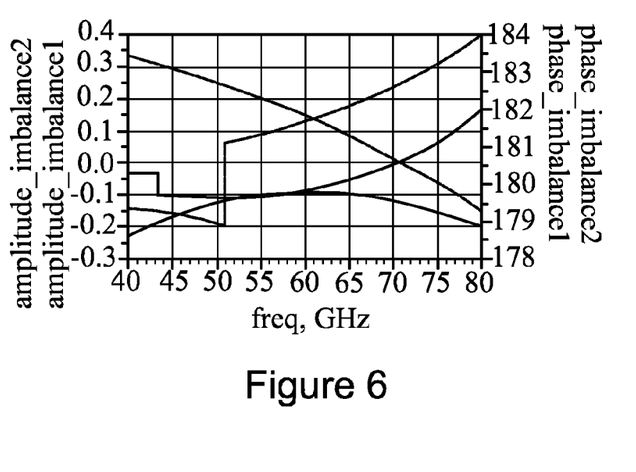

FIGS. 5-6 illustrate the improvements in performance that may be experienced using the proposed embodiments illustrated above with respect to FIGS. 1-4. For example, FIG. 5 illustrates an improvement of insertion loss of about 0.7 dB. Additionally, FIG. 6 shows the excellent performances of the amplitude imbalance and phase difference between conventional balun and the balun 100. Additionally, for the balun 100, the tuning line 115 can be used to improve the performances of the amplitude imbalance and phase difference further.

Figure 7:
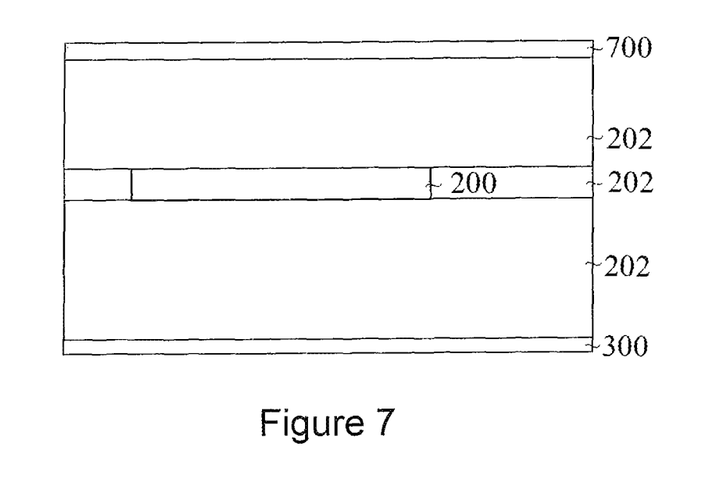
FIG. 7 illustrates a stripline embodiment of the Marchand balun in accordance with an embodiment.

FIG. 7 illustrates a cross-sectional view of another embodiment in which the balun 100 is formed using a stripline configuration. As illustrated, the signal layer 200 may be similar to the signal layer described above with respect to FIG. 2. However, instead of utilizing a single ground plane 300 (e.g., the ground plane 300 described above with respect to FIG. 3), a second ground plane 700 may be utilized on an opposite side of the signal plane 200 than the ground plane 300 (with insulative material 202 surrounding and separating the signal plane 200, the ground plane 300 and the second ground plane 700). The second ground plane 700 may be similar to the ground plane 300, and may also include the first slot line 303 and the second slot line 305, including the fingers 307.

Although the present embodiments and their advantages have been described in detail, it should be understood that various changes, substitutions and alterations can be made herein without departing from the spirit and scope of the embodiments as defined by the appended claims. For example, the primary coil described above for be connected to ground instead of being left open. Additionally, the coil shape illustrated above may instead be changed into other shapes as long as the primary coil, the first secondary coil, and the second secondary coil remain coupled.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. An electrical device comprising:
   a first transformer located in a first metal layer, the first transformer comprising:
      a primary line connected to an input port; and
      a first secondary line in proximity to the primary line and connected to a first output port, the primary line and the first secondary line separated from each other by a first region of dielectric material;
   a second transformer comprising:
      the primary line; and
      a second secondary line in proximity to the primary line and connected to a second output port different from the first output port; and
   a ground layer located in a second metal layer, the ground layer comprising a first slot line, the first slot line comprising a non-conductive material and being located beneath the first region.

2. The electrical device of claim 1, wherein the primary line and the second secondary line are separated from each other by a second region of dielectric material, further comprising a second slot line in the ground layer, the second slot line being located beneath the second region.

3. The electrical device of claim 1, wherein the primary line and the first secondary line are in a spiral shape.

4. The electrical device of claim 1, wherein the primary line is open.

5. The electrical device of claim 1, further comprising a tuning line in the primary line, wherein the tuning line extends at least partially into a third metal layer different from the first metal layer.

6. The electrical device of claim 1, further comprising fingers located along the first slot line.

7. The electrical device of claim 1, further comprising a via electrically coupling the first transformer to the ground layer.

8. An electrical device comprising:
   a first line connected to a first port, the first line comprising a tuning line;
   a second line in proximity with the first line to form a first transformer, the second line connected to a second port, the second line being separated from the first line by a first region;
   a third line in proximity with the first line to form a second transformer, the third line connected to a third port; and
   a via connecting the second line and the third line to a first reference voltage layer, the first reference voltage layer comprising a first slot line of dielectric material located directly beneath the first region.

9. The electrical device of claim 8, further comprising fingers located along the first slot line.

10. The electrical device of claim 9, wherein the fingers extend away from the first slot line perpendicularly to a longitudinal axis of the first slot line.

11. The electrical device of claim 8, wherein the tuning line extends into a separate metal layer than the second line.

12. The electrical device of claim 8, wherein the first reference voltage layer is a ground plane.

13. The electrical device of claim 8, wherein the transformer is a Marchand balun.

14. A method for forming an electrical device, the method comprising:
   forming a conductive ground plane over a substrate;
   forming a first slot line in the conductive ground plane, the first slot line comprising a first dielectric material, wherein the forming the first slot line further comprises forming fingers extending away from the first slot line; and
   forming a primary transmission line in proximity to a first transmission line and a second transmission line, the primary transmission line being separated from the first transmission line by a first region of second dielectric material, wherein the first slot line and the first region are located along a line perpendicular to the substrate.

15. The method of claim 14, further comprising forming a second slot line in the conductive ground plane, the second slot line comprising the first dielectric material, wherein the primary transmission line is separated from the second transmission line by a second region of second dielectric material and wherein the second slot line and the second region are located along a second line perpendicular to the substrate.

16. The method of claim 14, further comprising forming a tuning line located in the primary transmission line, the tuning line extending into a separate metal layer than the first slot line.

17. The method of claim 14, wherein the forming the transmission device comprises forming a Marchand balun.

18. The method of claim 14, wherein the forming the primary transmission line comprises forming the primary transmission line in a spiral shape.

19. The method of claim 18, wherein the forming the primary transmission line in proximity to a first transmission line further comprises forming the first transmission line parallel with the primary transmission line.

* * * * *